(12) United States Patent
Atsatt et al.

(10) Patent No.: US 11,520,388 B2
(45) Date of Patent: Dec. 6, 2022

(54) SYSTEMS AND METHODS FOR INTEGRATING POWER AND THERMAL MANAGEMENT IN AN INTEGRATED CIRCUIT

(71) Applicant: Intel Corporation, Santa Clara, CA (US)

(72) Inventors: Sean R. Atsatt, Santa Cruz, CA (US); Scott J. Weber, Piedmont, CA (US); Aravind Raghavendra Dasu, Milpitas, CA (US); Ravi Prakash Gutala, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 901 days.

(21) Appl. No.: 15/855,457

(22) Filed: Dec. 27, 2017

(65) Prior Publication Data
US 2019/0041923 A1   Feb. 7, 2019

(51) Int. Cl.
| | | |
|---|---|---|
| *G05B 15/02* | (2006.01) | |
| *G06F 1/20* | (2006.01) | |
| *H03K 19/0175* | (2006.01) | |
| *H03K 19/003* | (2006.01) | |
| *H03K 19/00* | (2006.01) | |
| *G06F 1/3287* | (2019.01) | |
| *H01L 23/538* | (2006.01) | |

(Continued)

(52) U.S. Cl.
CPC ............ *G06F 1/206* (2013.01); *G05B 15/02* (2013.01); *G06F 1/3287* (2013.01); *G06F 1/3296* (2013.01); *H01L 23/5383* (2013.01); *H03K 19/0008* (2013.01); *H03K 19/00369* (2013.01); *H03K 19/017581* (2013.01); *H01L 23/34* (2013.01); *H01L 23/367* (2013.01); *H01L 23/3675* (2013.01); *H01L 24/16* (2013.01); *H01L 25/18* (2013.01); *H01L 2224/16145* (2013.01); *H01L 2224/16225* (2013.01); *H01L 2224/16227* (2013.01); *H01L 2224/17181* (2013.01); *H01L 2924/1431* (2013.01); *H01L 2924/1435* (2013.01)

(58) Field of Classification Search
None
See application file for complete search history.

(56) References Cited

U.S. PATENT DOCUMENTS

| | | | |
|---|---|---|---|
| 5,955,870 A * | 9/1999 | Nair ....................... | G05F 1/575 323/280 |
| 6,396,137 B1 * | 5/2002 | Klughart ................. | H02M 3/00 257/691 |

(Continued)

OTHER PUBLICATIONS

Extended European Search Report for EP Application No. 18208735.3 dated May 6, 2019.
U.S. Appl. No. 15/828,238, filed Nov. 30, 2017, Atsatt et al.

*Primary Examiner* — Jason Lin
(74) *Attorney, Agent, or Firm* — Fletcher Yoder, P.C.

(57) ABSTRACT

An integrated circuit assembly may include an integrated circuit having a plurality of programmable logic sectors and an interposer circuit positioned adjacent to the integrated circuit. The interposer circuit may include at least one voltage regulator that distributes a voltage to at least one of the plurality of programmable logic sectors and at least one thermal sensor that measures a temperature of the at least one of the plurality of programmable logic sectors.

20 Claims, 9 Drawing Sheets

(51) Int. Cl.
*G06F 1/3296* (2019.01)
*H01L 25/18* (2006.01)
*H01L 23/367* (2006.01)
*H01L 23/00* (2006.01)
*H01L 23/34* (2006.01)

(56) References Cited

U.S. PATENT DOCUMENTS

| | | | | |
|---|---|---|---|---|
| 7,653,824 B2* | 1/2010 | Rangarajan | ............. | G06F 1/206 713/300 |
| 8,237,274 B1* | 8/2012 | Rahman | ................. | H01L 24/17 257/737 |
| 8,635,470 B1 | 1/2014 | Kraipak et al. | | |
| 9,059,696 B1 | 6/2015 | Rahman | | |
| 10,321,575 B2* | 6/2019 | Li | ............................ | H01L 21/56 |
| 2003/0081389 A1* | 5/2003 | Nair | ........................ | H01L 25/16 361/764 |
| 2006/0273809 A1* | 12/2006 | Miller | .............. | G01R 31/31905 324/750.05 |
| 2007/0052453 A1* | 3/2007 | Wald | ..................... | G06F 1/3296 327/100 |
| 2008/0281476 A1* | 11/2008 | Bose | ........................ | G05D 23/1932 700/300 |
| 2010/0072961 A1* | 3/2010 | Kosonocky | ............. | H01L 25/16 307/31 |
| 2013/0120021 A1* | 5/2013 | Chi | .................... | H03K 19/1737 326/37 |
| 2013/0285739 A1 | 10/2013 | Blaquiere et al. | | |
| 2015/0380377 A1* | 12/2015 | Uzoh | ..................... | H01L 23/42 257/773 |
| 2016/0018869 A1* | 1/2016 | Raghavan | ............. | G06F 1/3228 713/320 |
| 2017/0220445 A1* | 8/2017 | Cunningham | ....... | G06F 11/3089 |
| 2021/0018952 A1* | 1/2021 | Kajigaya | ................ | G11C 5/04 |

\* cited by examiner

SYSTEMS AND METHODS FOR INTEGRATING POWER AND THERMAL MANAGEMENT IN AN INTEGRATED CIRCUIT

BACKGROUND

This disclosure relates to enabling different regions of an integrated circuit to perform power management operations for different sectors or a collection of sectors in an integrated circuit. More specifically, the disclosure relates to providing systems and methods to integrate power and thermal management circuit components into a programmable logic device, such as a field programmable gate array (FPGA) device.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Programmable logic devices are a class of integrated circuits that can be programmed to perform a wide variety of operations. A programmable logic device may include programmable logic elements programmed by a form of memory known as configuration random access memory (CRAM). Thus, to program a circuit design into a programmable logic device, the circuit design may be compiled into a bitstream and programmed into CRAM cells. The values programmed into the CRAM cells define the operation of programmable logic elements of the programmable logic device.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor.

In some cases, an integrated circuit that contains programmable logic devices provides a highly flexible platform that can be configured after manufacturing with a custom circuit design. The flexibility and variability in the possible designs that may be programmed into this type of integrated circuit, however, also provides for different sectors of the integrated circuit to be used for different purposes and functions. As the integrated circuit is programmed to perform various operations, different sectors of the integrated circuit may be active or consuming dynamic power at different times. However, the integrated circuit often consumes static power even when a respective sector of the integrated circuit is not performing an operation. As such, it may be useful to control the power provided to different sectors of the integrated circuit based on a respective operation of each respective sector.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
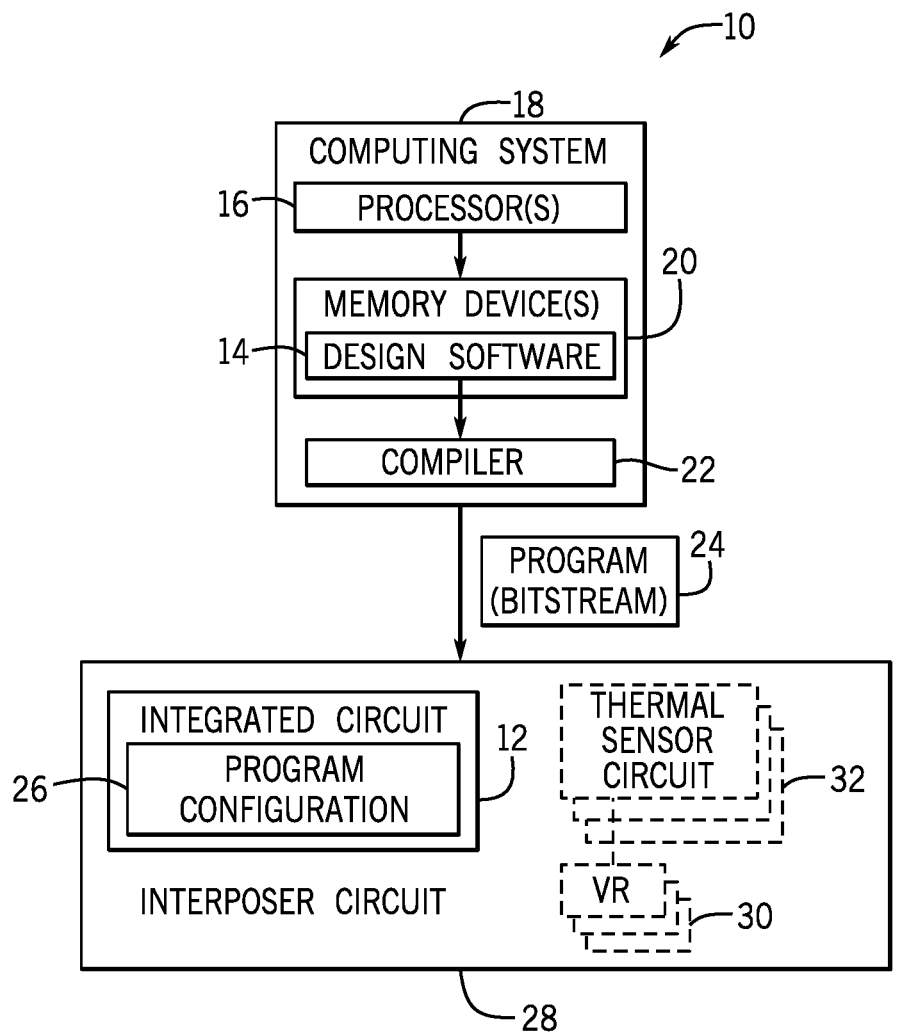
FIG. 1 illustrates a block diagram of a system for programming an integrated circuit based on a circuit design received by the integrated circuit, in accordance with an embodiment of the present disclosure.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

An integrated circuit consumes power when in operation, such as when implementing a design programmed in the integrated circuit. Generally, the integrated circuit will become less expensive to operate as it consumes less power. Moreover, less power consumption results in less heat dissipation, enabling the integrated circuit to operate at a cooler temperature. As a result, manufacturers may include more components on the integrated circuit and/or more tightly pack components on the integrated circuit. Furthermore, cooler operating temperatures increase the lifetime of the integrated circuit. Additionally, in cases where the power source of the integrated circuit is a battery, lower power consumption translates to longer battery life and/or smaller footprint of the battery (e.g., on a printed circuit board).

With this in mind, to reduce the power consumed by an integrated circuit, it may be useful to power down different regions of the integrated circuit that may not be in use. By way of example, an integrated circuit may be divided into multiple sectors, such that different sectors may be used to perform a variety of operations. To program each sector of the integrated circuit, configuration data may be routed to each sector via a configuration routing system to implement various designs in various sectors of the integrated circuit. In addition, because each sector may be employed for different operations, the integrated circuit may include one or more routed paths (e.g., circuit paths that connect components of the integrated circuit together using connective components such as wires) that allows for communication of user logic data from certain sectors of the integrated circuit to other sectors in the integrated circuit, components that may be accessible via the periphery of the integrated circuit, and the like. With this in mind, if a collection of sectors or sector group is powered by a voltage regulator disposed on the integrated circuit, communicating configuration data and/or user logic data between sectors, components, and the like may become challenging when the sector group is powered down. That is, since data may not be transmitted via sectors located in a powered down sector group, the data may be transmitted to its destination when an alternate communication route has been identified or is present.

With this in mind, this disclosure relates generally to integrating one or more voltage regulators (e.g., fully integrated voltage regulator (FIVR)) and one or more thermal sensors controller into an integrated circuit, such that each sector or a collection of sectors within the integrated circuit may be operated according to different power management schemes (e.g., power down regions, voltage frequency scaling, dynamic voltage frequency scaling, temperature margin recovery). That is, one voltage regulator may be electrically coupled to one or more sectors of an integrated circuit to provide power to the respective one or more sectors.

To provide different types of power management operations to each sector or a collection of sectors (i.e., sector group) in an integrated circuit, multiple voltage regulators may be incorporated into a single integrated circuit. In some cases, these voltage regulators may be positioned at the edges of the integrated circuit, such that one voltage regulator may provide voltage to one or more adjacent sectors in the integrated circuit. Although the placement of these voltage regulators at the edge of the integrated circuit may improve the ability of different sectors in the integrated circuit to communicate with each other without routing data around a voltage regulator, the performance of the integrated circuit may be reduced. Moreover, the placement of voltage regulators at the edge of the integrated circuit also makes communication between sectors in the integrated circuit more difficult in situations when certain sectors are powered down by a respective voltage regulator. In the same manner, when certain sectors of the integrated circuit are powered down by a respective voltage regulator, the ability of the integrated circuit to use different sectors for performance scaling becomes less viable if the respective sectors are separated by unpowered sectors.

With the foregoing in mind, in certain embodiments of the present disclosure, one or more voltage regulators may be embedded into a separate interposer device that may be disposed above or below the integrated circuit. The interposer device may include one voltage regulator per sector of the integrated circuit or one voltage regulator per sector group of the integrated circuit. In either case, by positioning the voltage regulators on the interposer device, as opposed to the integrated circuit, the sectors of the integrated circuit may have increased flexibility in communicating and distributing power with each other due to more granularly dispersed voltage regulators. That is, instead of controlling the power provided to sectors of the integrated circuit based on the location of a respective voltage regulator on the integrated circuit, more voltage regulators may be placed on the interposer device to provide voltage to more sectors or group of sectors without being limited to distributing voltage to sectors positioned within a proximity of a respective edge of the integrated circuit. In other words, since the interposer device provides an additional plane in which multiple voltage regulators may be electrically coupled to different sectors or sector groups to improve the reachability of the voltage regulator to their respective sectors or sector groups without inhibiting the communication of configuration data or user data between sectors of the integrated circuit.

It should be noted that the respective sectors may include circuit components between each other to isolate the power to a respective sector, perform dynamic voltage frequency scaling (DVFS) operations, and the like. For example, circuits that isolate and/or level shifters may be positioned between sectors to allow inter-sector wires to operation under various voltage operations (e.g., power down, frequency scaling). In some embodiments, performance monitoring circuits may track the operations of each sector and control the voltage frequency scaling operations, the power down operations, and the isolation circuit operations based on the properties of a respective sector.

In addition to incorporating the voltage regulators into the interposer device, in some embodiments, thermal sensor circuitry may also be incorporated into the interposer device to monitor the temperature of the sectors in the integrated circuit. That is, one or more thermal sensors may be disposed on the integrated circuit to measure the temperature of one or more sectors or one or more sector groups positioned adjacent to the thermal sensors. In some embodiments, based on the temperature measurements received via the thermal sensors, a thermal sensor controller of the thermal sensor circuitry may adjust the operations of a respective voltage regulator coupled to the respective sector or sector group to improve the operations of the integrated circuit.

Keeping the foregoing in mind, in certain embodiments, multiple voltage regulators may be incorporated into an interposer device that may be coupled to the integrated circuit to provide power (e.g., voltage) to different sectors or sector groups in the integrated circuit. As such, voltage regulators may be used to control more sectors or sector groups, as compared to voltage regulators disposed on the integrated circuit itself. The additional voltage regulators may enable the integrated circuit to control power operations (e.g., power down, voltage frequency scaling, dynamic voltage frequency scaling) to additional sectors of the integrated circuit, as compared to the voltage regulators disposed on the integrated circuit itself.

The increased density of voltage regulators available to control voltage operations to a number of sectors in the integrated circuit provide for improved power management capabilities for the integrated circuit. Moreover, the ability to control the power provided to each sector of the integrated circuit may enable the integrated circuit to enable certain sectors to operate at higher voltages as compared to other sectors within the integrated circuit to provide improved performance for the respective operations performed by the certain sectors.

As discussed above, in addition to the increased availability of voltage regulators, in certain embodiments, the interposer device may include thermal sensor circuitry for each sector or for each of a number of sector groups in the integrated circuit to monitor the temperature of the respective sector or respective sector group. By including the thermal sensor circuitry on the same interposer device as the voltage regulators, a controller of the thermal sensor circuitry may control operations of a respective voltage regulator based on the temperature of the respective sector or respective sector group. As a result, the integrated circuit may have improved thermal management by ensuring that different sectors or sector groups operate within a desired temperature range. Additional details with regard to the embodiments described above will be provided below with reference to FIGS. 1-5.

By way of introduction, FIG. 1 illustrates a block diagram of a system 10 that may program an integrated circuit 12 based on a design programmed received by the integrated circuit 12, in accordance with an embodiment of the present disclosure. The integrated circuit 12 may be reconfigurable program logic device (e.g., a field programmable gate array (FPGA)) that has separate die for programmable logic fabric and fabric support circuitry. A user may implement a circuit design to be programmed onto the integrated circuit 12 using design software 14, such as a version of Quartus® by Intel.

The design software 14 may be executed by one or more processors 16 of a computing system 18. The computing system 18 may include any suitable device capable of executing the design software 14, such as a desktop computer, a laptop, a mobile electronic device, a server, and the like. The computing system 18 may access, configure, and/or communicate with the integrated circuit 12. The processor(s) 16 may include multiple microprocessors, one or more other integrated circuits (e.g., application specific integrated circuits, field programmable gate arrays, reduced instruction set processors, and the like), or some combination thereof.

One or more memory devices 20 may store the design software 14. In addition, the memory device(s) 20 may store information related to the integrated circuit 12, such as control software, configuration software, look up tables, configuration data, etc. In some embodiments, the processor(s) 16 and/or the memory device(s) 20 may be external to the computing system 18. The memory device(s) 20 may include a tangible, non-transitory, machine-readable-medium, such as a volatile memory (e.g., a random-access memory (RAM)) and/or a nonvolatile memory (e.g., a read-only memory (ROM)). The memory device(s) 20 may store a variety of information and be used for various purposes. For example, the memory device(s) 20 may store machine-readable and/or processor-executable instructions (e.g., firmware or software) for the processor(s) 16 to execute, such as instructions to determine a speed of the integrated circuit 12 or a region of the integrated circuit 12, determine a criticality of a path of a design programmed in the integrated circuit 12 or a region of the integrated circuit 12, programming the design in the integrated circuit 12 or a region of the integrated circuit 12, and the like. The memory device(s) 20 may include one or more storage devices (e.g., nonvolatile storage devices) that may include read-only memory (ROM), flash memory, a hard drive, or any other suitable optical, magnetic, or solid-state storage medium, or any combination thereof.

The design software 14 may use a compiler 22 to generate a low-level circuit-design program 24 (bitstream), sometimes known as a program object file and/or configuration program, that programs the integrated circuit 12. That is, the compiler 22 may provide machine-readable instructions representative of the circuit design to the integrated circuit 12. For example, the integrated circuit 12 may receive one or more programs 24 (bitstreams) that describe the hardware implementations that should be stored in the integrated circuit 12. The programs 24 (bitstreams) may programmed into the integrated circuit 12 as a program configuration 26.

The program configuration 26 may be represented as "configuration data" that is routed to various sectors of the programmable logic device, even when one or more of those sectors are powered down. The program configuration 26 may, in some cases, represent an accelerator function to perform for machine learning, video processing, voice recognition, image recognition, or other highly specialized task.

Figure 2:
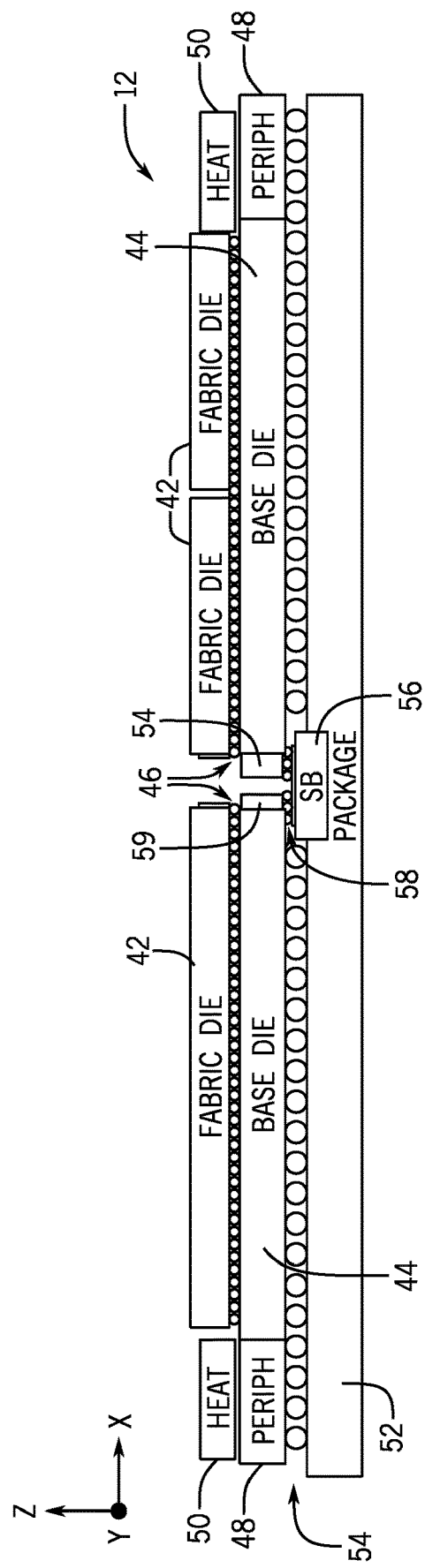
FIG. 2 is a block diagram of a package including the programmable logic device where a fabric die is vertically stacked with a base die, in accordance with an embodiment.

In one embodiment, the integrated circuit 12 may be part of a fabric die, which will be discussed in greater detail below with reference to FIG. 2. The integrated circuit 12 electrically coupled to an interposer circuit 28, which may be part of a fabric die support that will be discussed below with reference to FIG. 2. The interposer circuit 28 may be a silicon interposer that includes a number of circuit components that may provide power, data, control commands, and the like to sectors on the integrated circuit 12. As such, the interposer circuit 28 may be positioned substantially parallel to the integrated circuit 12 and may be electrically coupled to the integrated circuit 12 via micro bumps disposed between the interposer circuit 28 and the integrated circuit 12. As will be discussed below, the micro bumps may enable different circuit components on the interposer circuit 28 to be coupled to specific circuit components on the integrated circuit 12.

By way of example, the circuit components disposed on the interposer circuit 28 may include one or more voltage regulators 30, one or more thermal sensor circuits 32, and the like. The voltage regulators 30 may include voltage sources that provide voltage to one or more sectors in the integrated circuit 12. In one embodiment, the voltage regulator 30 may include a fully-integrated voltage regulator (FIVR) circuit that provides for control of the voltage applied to a respective sector of the integrated circuit 12. As such, the voltage regulator 30 may provide power, voltage frequency changes, action voltage recovery margin operations, dynamic voltage frequency scaling, and other voltage signals to the sectors of the integrated circuit 12.

The thermal sensor circuits 32 may include one or more thermal sensors that measure a temperature or an amount of heat generated from a sector or a portion of the integrated circuit or a portion of the interposer circuit 28. In addition, the thermal sensor circuits 32 may include a controller that may receive data from the thermal sensor and send signals that control the operation of the voltage regulators 30. For instance, the controller may send commands to the voltage regulator 30 to cease operations, increase voltage frequency, decrease voltage frequency, and the like.

By including the voltage regulators 30 and the thermal sensor circuits 32 on the interposer circuit 28 that lies on a separate plane as compared to the integrated circuit 12, the system 10 may include more voltage regulators 30 and thermal sensor circuits 32, as compared to incorporating these components in the integrated circuit 12. As a result, the voltage regulators 30 may provide voltage and control voltage operations of more sectors in the integrated circuit 12. Indeed, in some embodiments, each sector of the integrated circuit 12 may include a dedicated voltage regulator 30 and thermal sensor circuit 32 couple thereto via the interposer circuit 28. In this way, each individual sector or a collection of sectors (i.e., sector group) may be powered down, have their respective voltage signals adjusted, and the like.

By using the voltage regulators 30 disposed on the interposer circuit 28 to manage the power provides to each sector of the integrated circuit 12, the integrated circuit 12 may provide additional routes in which data may be communicated between sectors of the integrated circuit 12, as compared to when voltage regulators 30 are disposed on the integrated circuit 12 itself. That is, due to the limited space available on the integrated circuit 12, any particular voltage regulator 30 disposed thereon may control multiple sectors that render a region or certain area of the integrated circuit 12 inaccessible when powered down. In contrast, by individually managing the power provided to individual sectors in the integrated circuit 12 via the interposer circuit 28, the integrated circuit 12 may avoid powering down entire regions or portions of the integrated circuit 12. Instead, the powered down sectors may be dispersed across the integrated circuit or selected based on a provision to maintain connectivity in any particular direction across certain sectors in the integrated circuit 12. In addition, in some embodiments, a network-on-chip (NOC) may be integrated into the interposer circuit 28, such that the NOC is continuously powered to provide configuration and/or user data to any sector of the integrated circuit.

The thermal sensor circuits 32 may also provide similar advantages in monitoring the temperature of different individual sectors in the integrated circuit 12. Moreover, the controllers of the thermal sensor circuits 32 may control the power provided to the sectors of the integrated circuit 12 by controlling the respective voltage regulators 30. By using the temperature data to control the operations of the voltage regulators and thus the sectors of the integrated circuit 12, the integrated circuit 12 may reduce the amount of power used by the integrated circuit 12. For example, the integrated circuit 12 may suspend certain operations when the sectors performing those operations are operating at a temperature above a threshold. In addition, if the sector temperature is above a threshold, the integrated circuit 12 or a controller that manages the operations of the sectors in the integrated circuit 12 may shift the operations performed by the high temperature sector to another sector. As such, the integrity and lifespan of the integrated circuit 12 may be extended by preventing certain sectors from operating at high temperatures. The integrated circuit 12 may represent any integrated circuit device that includes a programmable logic device with two separate integrated circuit die where at least some of the programmable logic fabric is separated from at least some of the fabric support circuitry that operates the programmable logic fabric. One example of the programmable logic device 12 is shown in FIG. 2, but it should be understood that this disclosure is intended to encompass any suitable integrated circuit 12 where programmable logic fabric and fabric support circuitry are at least partially separated on different integrated circuit die. Indeed, in the example of FIG. 2, the integrated circuit 12 includes a fabric die 42 and a base die 44 that are connected to one another via microbumps 46. Although the fabric die 42 and base die 44 appear in a one-to-one relationship in FIG. 2, other relationships may be used. For example, a single base die 44 may attach to several fabric die 42, or several base die 44 may attach to a single fabric die 42, or several base die 44 may attach to several fabric die 42 (e.g., in an interleaved pattern along the x- and/or y-direction). Peripheral circuitry 48 may be attached to or embedded within, and/or disposed on top of the base die 24, and heat spreaders 50 may be used to reduce an accumulation of heat on the integrated circuit 12. The heat spreaders 50 may appear above, as pictured, and/or below the package (e.g., as a double-sided heat sink). The base die 44 may attach to a package substrate 52 via C4 bumps 54. In the example of FIG. 2, two pairs of fabric die 42 and base die 44 are shown communicatively connected to one another via a silicon bridge 46 (e.g., an embedded multi-die interconnect bridge (EMIB)) and microbumps at a silicon bridge interface 59.

Figure 3:
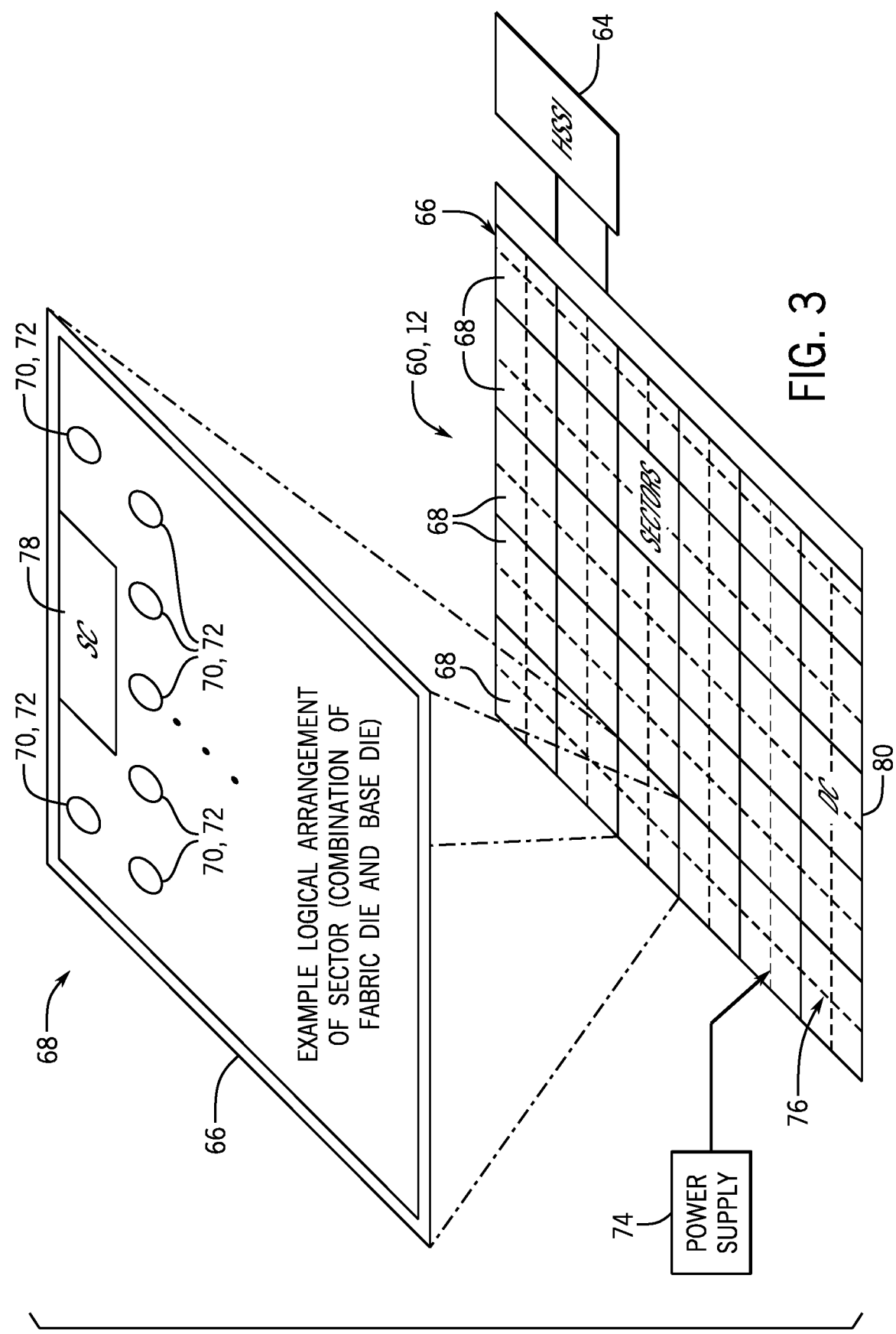
FIG. 3 is a block diagram of an example logical arrangement of the programmable logic device, in accordance with an embodiment.
Figure 4:
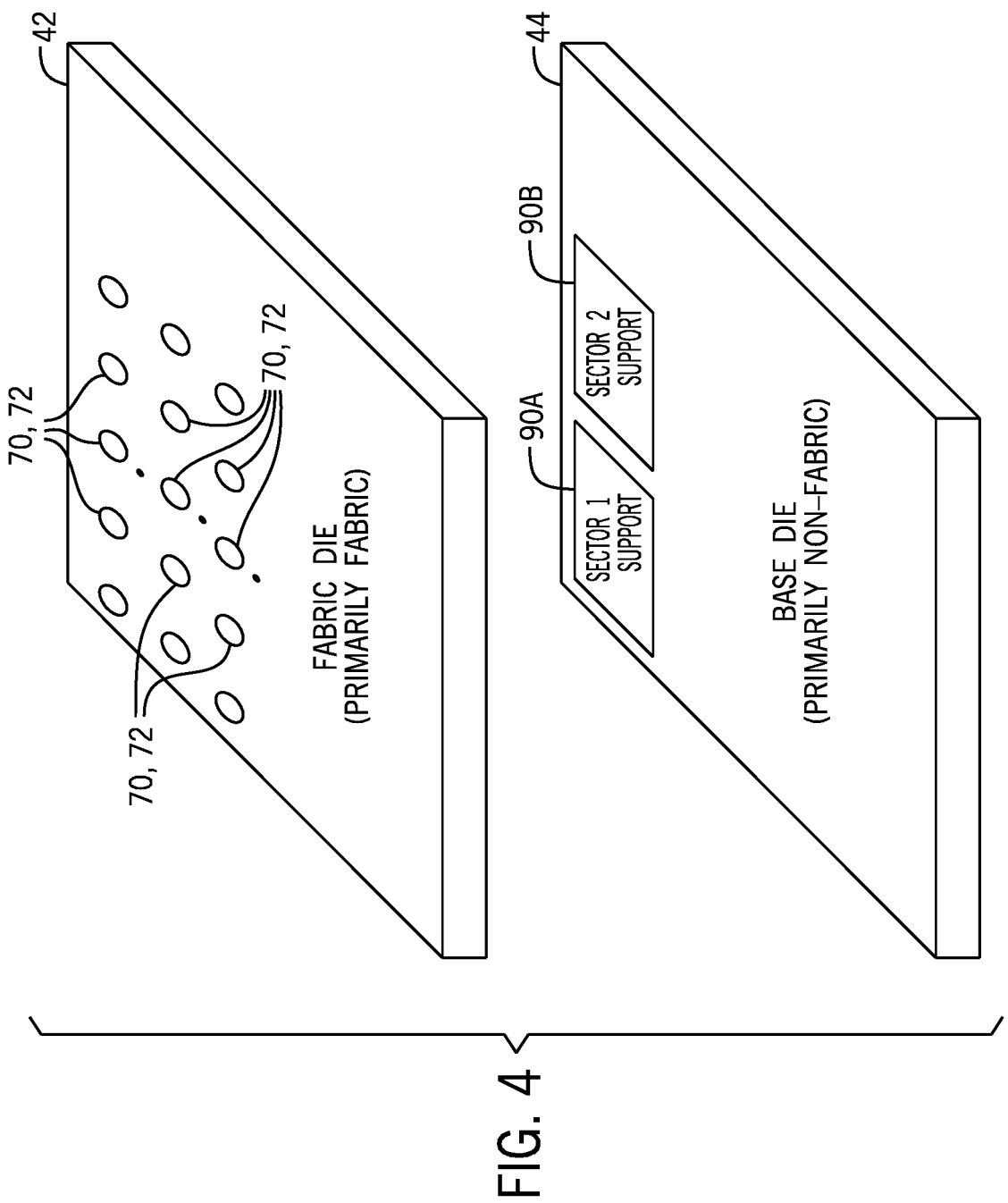
FIG. 4 is a block diagram showing a fabric die of the programmable logic device that contains programmable logic fabric and a base die of the programmable logic device that contains primarily non-fabric circuitry that operates the programmable logic fabric, in accordance with an embodiment.

In combination, the fabric die 42 and base die 44 may operate as a programmable logic device, such as a field programmable gate array (FPGA). For example, the fabric die 42 and the base die 44 may operate in combination as an FPGA 60, shown in FIG. 3. It should be understood that the FPGA 60 shown in FIG. 3 is meant to represent the type of circuitry and/or a logical arrangement of a programmable logic device when the both the fabric die 42 and the base die 44 operate in combination. In other words, some of the circuitry of the FPGA 60 shown in FIG. 3 may be found in the fabric die 42 and some of the circuitry of the FPGA 60 shown in FIG. 3 may be found in the base die 44. Moreover, for the purposes of this example, the FPGA 60 is referred to as an FPGA, though it should be understood that the device may be any suitable type of programmable logic device (e.g., an application-specific integrated circuit and/or application-specific standard product).

In the example of FIG. 3, the FPGA 60 may include transceiver circuitry (HSSI) 64 for driving signals off of the FPGA 60 and for receiving signals from other devices. The transceiver circuitry (HSSI) may be part of the fabric die 42, the base die 44, or a separate die altogether. Interconnection resources 66 may be used to route signals, such as clock or data signals, through the FPGA 60. The FPGA 60 of FIG. 3 is shown to be sectorized, meaning that programmable logic resources may be distributed through a number of discrete programmable logic sectors 68. Each programmable logic sector 68 may include a number of programmable logic elements 70 having operations defined by configuration memory 72 (e.g., configuration random access memory (CRAM)). The programmable logic elements 70 may include combinational or sequential logic circuitry. For example, the programmable logic elements 70 may include look-up tables, registers, multiplexers, routing wires, and so forth. A designer may program the programmable logic elements 70 to perform a variety of desired functions. A power supply 74 may provide a source of voltage and current to a power distribution network (PDN) 76 that distributes electrical power to the various components of the FPGA 60. Operating the circuitry of the FPGA 60 causes power to be drawn from the power distribution network 76.

There may be any suitable number of programmable logic sectors 68 on the FPGA 60. Indeed, while 29 programmable logic sectors 68 are shown here, it should be appreciated that more or fewer may appear in an actual implementation (e.g., in some cases, on the order of 50, 100, or 1000 sectors or more). Each programmable logic sector 48 may include a sector controller (SC) 78 that controls the operation of the programmable logic sector 68. Each sector controller 78 may be in communication with a device controller (DC) 80. Each sector controller 78 may accept commands and data from the device controller 80, and may read data from and write data into its configuration memory 72 based on control signals from the device controller 80. In addition to these operations, the sector controller 78 and/or device controller 80 may be augmented with numerous additional capabilities. Such capabilities may include coordinating memory transactions between local fabric memory (e.g., local fabric memory or CRAM being used for data storage) and sector-aligned memory associated with that particular programmable logic sector 68, decrypting configuration programs (bitstreams) 24, and locally sequencing reads and writes to implement error detection and correction on the configuration memory 72 and sequencing test control signals to effect various test modes.

The sector controllers 78 and the device controller 80 may be implemented as state machines and/or processors. For example, each operation of the sector controllers 78 or the device controller 80 may be implemented as a separate routine in a memory containing a control program. This control program memory may be fixed in a read-only memory (ROM) or stored in a writable memory, such as random access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 68. This may provide usable extensibility in an efficient and easily understood way. This may be useful because new commands could bring about large amounts of local activity within the sector at the expense of only a small amount of communication between the device controller 80 and the sector controllers 78.

Each sector controller 78 thus may communicate with the device controller 80, which may coordinate the operations of the sector controllers 78 and convey commands initiated from outside the FPGA device 60. To support this communication, the interconnection resources 66 may act as a network between the device controller 80 and each sector controller 78. The interconnection resources may support a wide variety of signals between the device controller 80 and each sector controller 78. In one example, these signals may be transmitted as communication packets.

The FPGA 60 may be electrically programmed. With electrical programming arrangements, the programmable elements 70 may include one or more logic elements (wires, gates, registers, etc.). For example, during programming, configuration data is loaded into the configuration memory 72 using pins and input/output circuitry. In one example, the configuration memory 72 may be implemented as configuration random-access-memory (CRAM) cells. The use of configuration memory 72 based on RAM technology is described herein is intended to be only one example. Moreover, configuration memory 72 may be distributed (e.g., as RAM cells) throughout the various programmable logic sectors 68 the FPGA 60. The configuration memory 72 may provide a corresponding static control output signal that controls the state of an associated programmable logic element 70 or programmable component of the interconnection resources 66. The output signals of the configuration memory 72 may be applied to the gates of metal-oxide-semiconductor (MOS) transistors that control the states of the programmable logic elements 70 or programmable components of the interconnection resources 66.

As stated above, the logical arrangement of the FPGA 60 shown in FIG. 3 may result from a combination of the fabric die 42 and base die 44. The circuitry of the fabric die 42 and base die 44 may be divided in any suitable manner. In one example, shown in block diagram form in FIG. 4, the fabric die 42 contains primarily programmable logic fabric resources, such as the programmable logic elements 70 and configuration memory 72. In some cases, this may also entail certain fabric control circuitry such as the sector controller (SC) 78 or device controller (DC) 80. The base die 44 may include supporting circuitry to operate the programmable logic elements 70 and configuration memory 72.

Shown here, the base die 44 includes sector 1 support circuitry 90A and sector 2 support circuitry 90B to support two corresponding sectors of the programmable logic elements 70 and configuration memory 72 of the fabric die 42. The base die 44 may also include support circuitry for other sectors of the fabric die 42.

The fabric die 42 and the base die 44 may collectively hold any suitable circuitry that may encompass the integrated circuit 12. Thus, in one example, the fabric die 42 may include primarily programmable logic fabric resources, such as the programmable logic elements 70 and configuration memory 72, the base die 44 may include, among other things, a device controller (DC) 80, a sector controller (SC) 78, a configuration network on chip (CNOC), a network-on-chip (NOC) data routing circuitry, sector-aligned memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, and/or electrostatic discharge (ESD) circuitry, to name just a few elements that may be present on the base die 64. It should be understood that some of these elements that may be part of the fabric support circuitry of the base die 24 may additionally or alternatively be a part of the fabric die 22. For example, the device controller (DC) 60 and/or the sector controllers (SC) 58 may be part of the fabric die 22.

Figure 5:
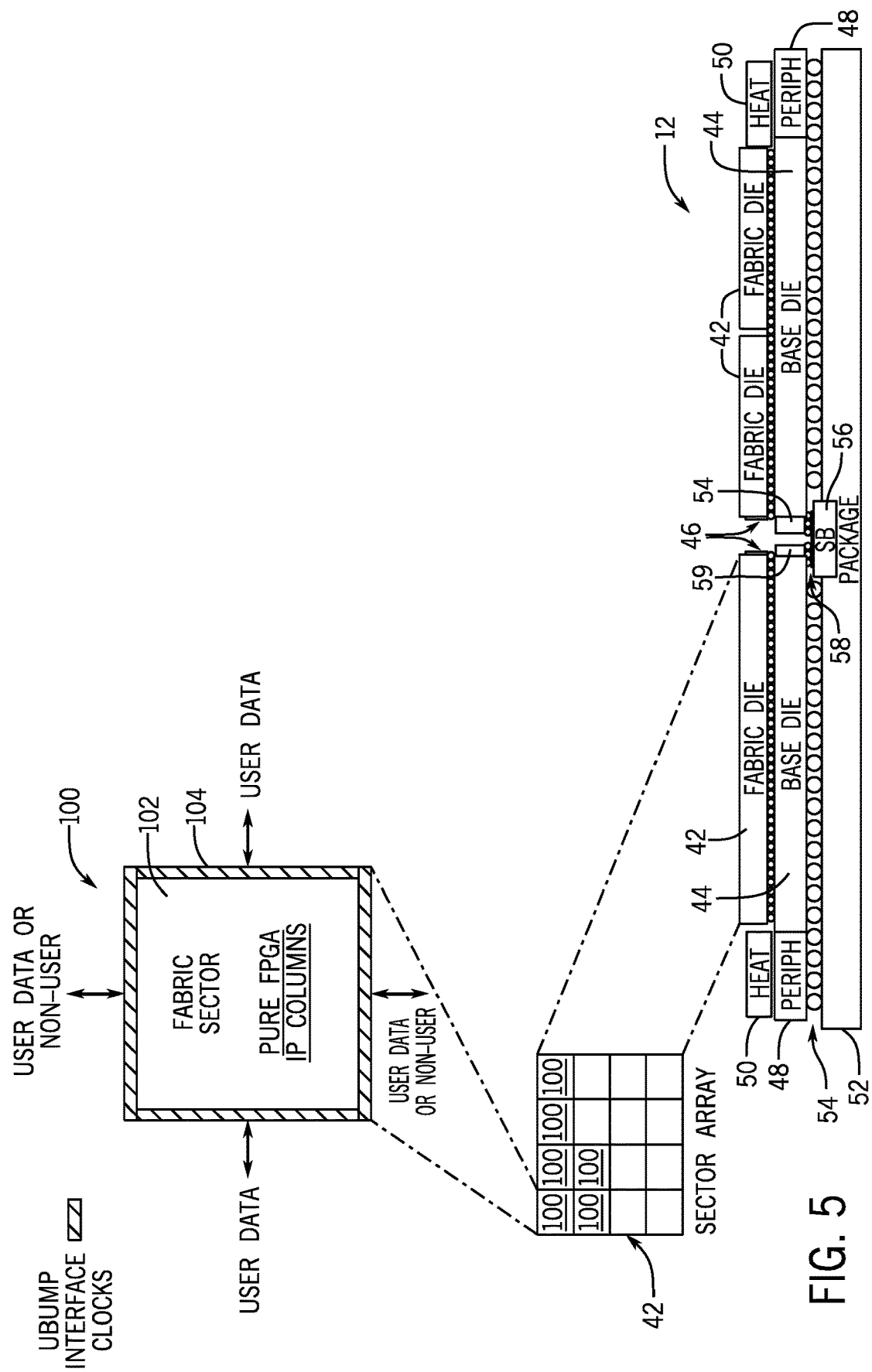
FIG. 5 is a block diagram of an example topology of the fabric die, in accordance with an embodiment.

One physical arrangement of the fabric die 42 is shown in FIG. 5. The fabric die 42 may contain an array of fabric sectors 100 that include fabric resources 102 (e.g., programmable elements programmed by CRAM and/or certain fabric control circuitry such as the sector controller (SC) 78 or device controller (DC) 80) and interface circuitry 104. The interface circuitry 104 may include data routing and/or clocking resources, and may contain a micro-bump (ubump) interface to connect to the base die 44.

Figure 6:
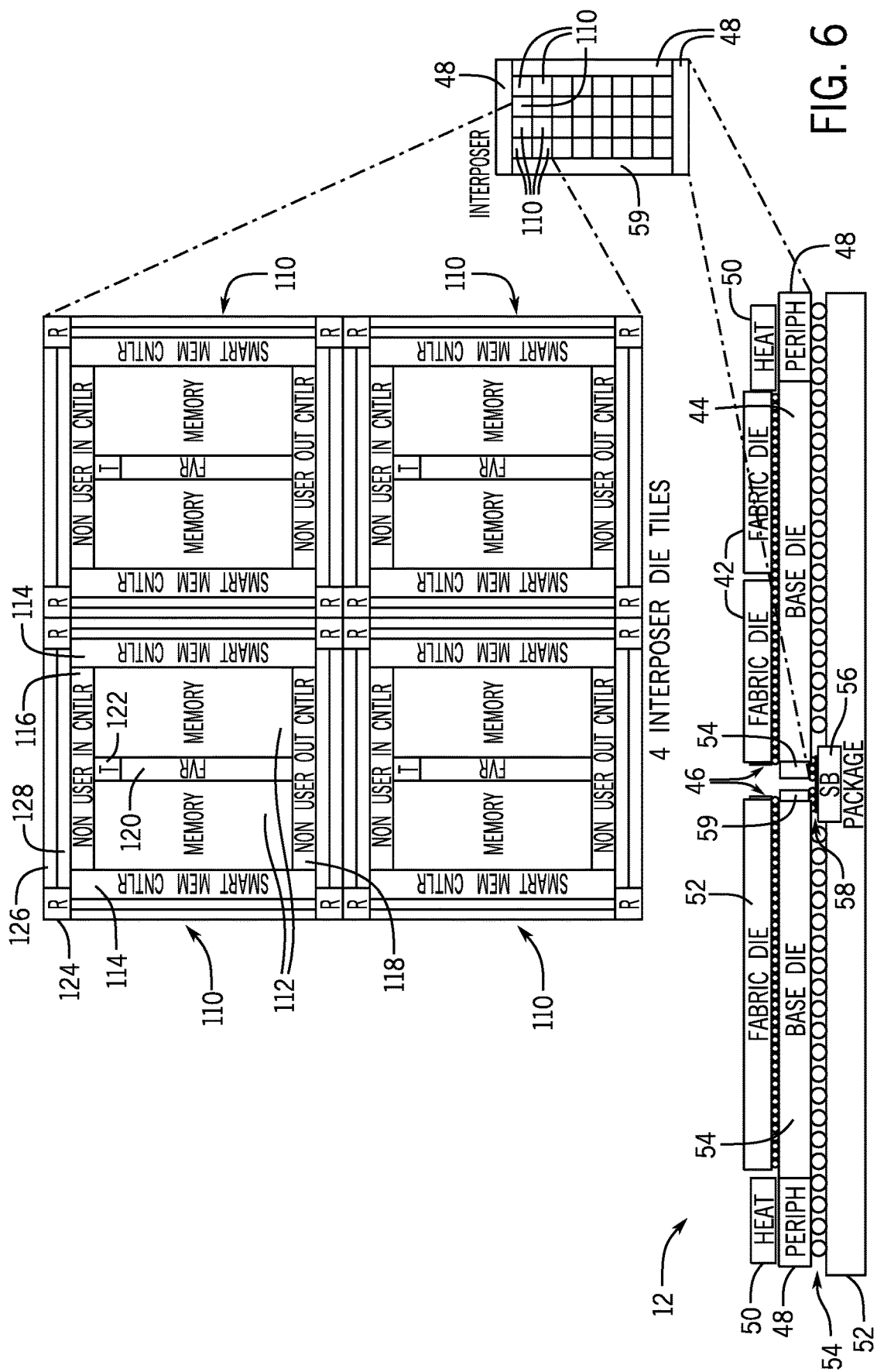
FIG. 6 is a block diagram of an example topology of the base die, in accordance with an embodiment.

FIG. 6 provides a complementary arrangement of the base die 44. The base die 44 may represent an active interposer with several sectors 110 surrounded by peripheral circuitry 48 and the silicon bridge interface 59. Each sector 110 may include a variety of fabric support circuitry, such as sector-aligned memory 112, memory control circuitry 114, non-user input control circuitry 116, non-user output control circuitry 118, a voltage regulator such as a fully integrated voltage regulator (FIVR) 120, one or more thermal sensors 122, data and configuration routers 124, and/or data pathways 126 and configuration pathways 128. The memory control circuitry 114 may be used to program the sector-aligned memory 112, the CRAM of the fabric die 42, or both. The non-user input control circuitry 116 and non-user output control circuitry 118 may allow the circuitry of the sectors 110 to exchange data and/or control signals (e.g., via a configurable data routing network-on-chip (NOC) or a configuration network on chip (CNOC)). In one example, the non-user input control circuitry 116 and non-user output control circuitry 118 may operate as the sector controller (SC) 78 for a corresponding fabric sector 80 (as shown in FIG. 5). The FIVR 120 and the one or more thermal sensors 122 may be used to provide a desired voltage to the corresponding fabric sector 100 (as shown in FIG. 5), enabling the voltage to be selectively scaled up or down, or removed, depending on power and thermal specifications (e.g., based at least in part on temperature as measured by a thermal sensor 122 and/or in accordance with a dynamic voltage and frequency scaling (DVFS) scheme). Even though the thermal sensors 122 are in a separate die from that of the programmable logic fabric elements, when the base die 44 is directly adjacent to the fabric die 42 as in this example, the temperature measured by the thermal sensor in the base die 44 may correspond well enough to the fabric die 42 to allow for temperature-based operations (e.g., turn off power to the corresponding fabric sector 100 to prevent a permanent-denial-of-service (PDOS) condition). While the physical arrangement shown in FIGS. 5 and 6 represent one example of the division of programmable logic device circuitry between the fabric die 42 and the base die 44, there are many suitable arrangements.

Figure 7:
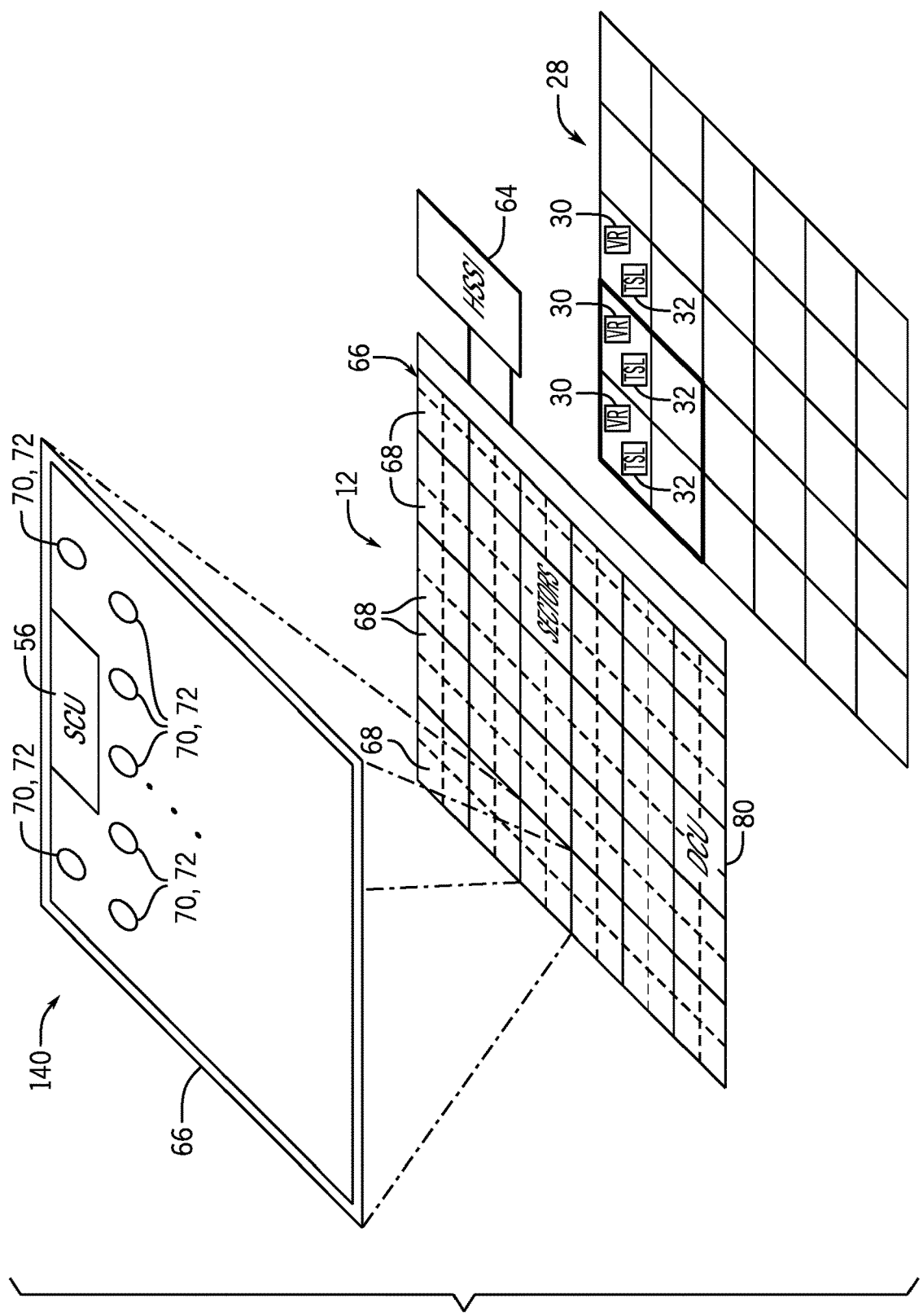
FIG. 7 is a diagram of a system that includes different layers of the integrated circuit of FIG. 1, in accordance with an embodiment of the present disclosure.

With the foregoing in mind, FIG. 7 is a diagram of a system 40 that illustrates sectors 68 of the integrated circuit 12 of FIG. 3, in accordance with an embodiment of the present disclosure. In addition to the integrated circuit 12 that may be part of the fabric die 42, the system 40 may also include the interposer circuit 28, as described above. The interposer circuit 28 may be part of the base die 44. In certain embodiments, the interposer circuit 28 may include a number of voltage regulators 30 and thermal sensor circuits 32 disposed across the interposer circuit 28, such that each respective voltage regulator 30 and thermal sensor circuit 32 may be positioned above or below a respective sector 68 or group of sectors 68. As such, each respective voltage regulator 30 may provide voltage to a respective sector 68 via circuit connections disposed between the voltage regulator 30 and the respective sector 68 via micro bumps or the like. In any case, since the voltage regulator 30 may be positioned above or below a corresponding sector 68, the system 40 may avoid routing voltage in a variety of directions to reach the respective sector 68. Indeed, one voltage regulator 30 disposed on the interposer circuit 28 may provide voltage to a corresponding sector 68 or group of sectors 68 via electrical connections that traverse in one direction.

Figure 8:
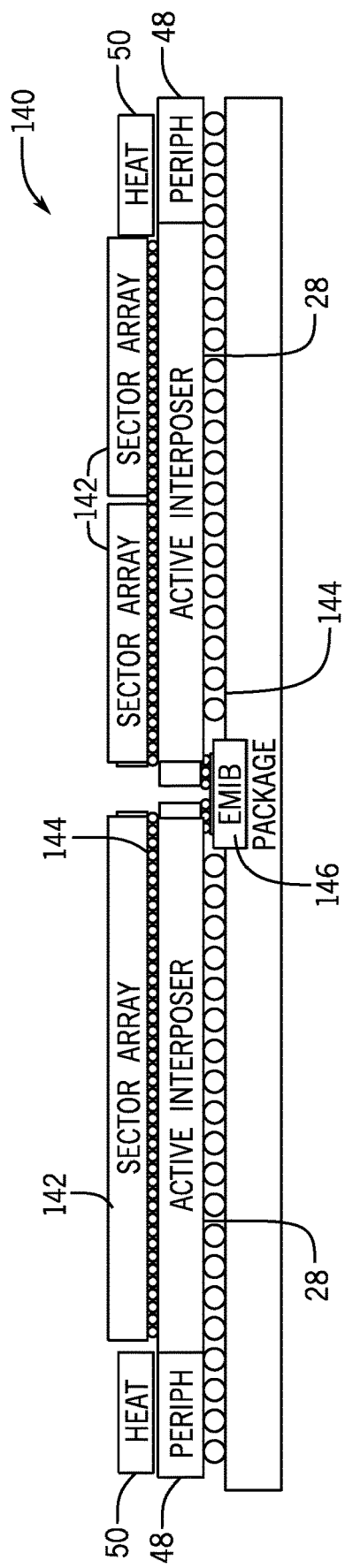
FIG. 8 is block diagram illustrating a side profile of the different layers in the integrated circuit of FIG. 1, in accordance with an embodiment of the present disclosure.

With the foregoing in mind, FIG. 8 illustrates a block diagram of a side profile of an integrated circuit assembly 140 that includes a sector array 142 within the base die 42 positioned over the interposer circuit 28 within the fabric die support 44. Although not shown in FIG. 3, the interposer circuit 28 may include the voltage regulators 30 and the thermal sensor circuits 32 described above.

The sector array 142 may include a number of sectors 68 to perform various operations on the integrated circuit 12. In one embodiment, the sector array 142 may be electrically coupled to the interposer circuit 28 via a number of micro bumps 144. The micro bumps 74 may be solder bumps that may be deposited on the sector array 142 or the interposer circuit 28 to provide an electrical connection between the two. In some embodiments, one voltage regulator 30 may be electrically coupled to one sector 68 or to a collection of sectors 68 via one or more micro bumps 144 disposed between the respective voltage regulator 30 and the sector 68 or sector group.

By way of example, the sector 68 may receive user data or data from other components outside the integrated circuit 12 or from other sectors 68 within the integrated circuit 12 from any suitable direction. That is, the sector 68 may receive user data from both the vertical and horizontal directions. In addition, the sector 68 may receive non-user data or configuration data in a vertical direction as the configuration data is propagated to each configuration memory 48 of each sector 68.

The sector array 142 may be positioned, in one embodiment, above the interposer circuit 28, as illustrated in FIG. 8. With this in mind, one sector array 142 and corresponding interposer circuit 28 may make up one integrated circuit assembly 140. To communicate between individual integrated circuit assemblies 70, an embedded multi-die interconnect bridge (EMIB) 146 may be placed between integrated circuit assemblies 170. The EMIB 146 may provide an electrical interconnect between the two integrated circuit assemblies 140 or two heterogeneous die in the same package. As such, different integrated circuit assemblies 140 may communicate with each other via the respective interposer circuits 28, which may transmit the data to different sectors 68 of different sector arrays 142.

To communicate data between different die tiles on the interposer circuit 28 that may include different voltage regulators 30 and thermal sensor circuits 32, the interposer circuit 28 may include a network on chip (NOC) system integrated therein. For example, FIG. 9 illustrates various components including a NOC system that may be disposed on four die tiles 152 that may include the voltage regulators 30 and thermal sensor circuits 32.

Figure 9:
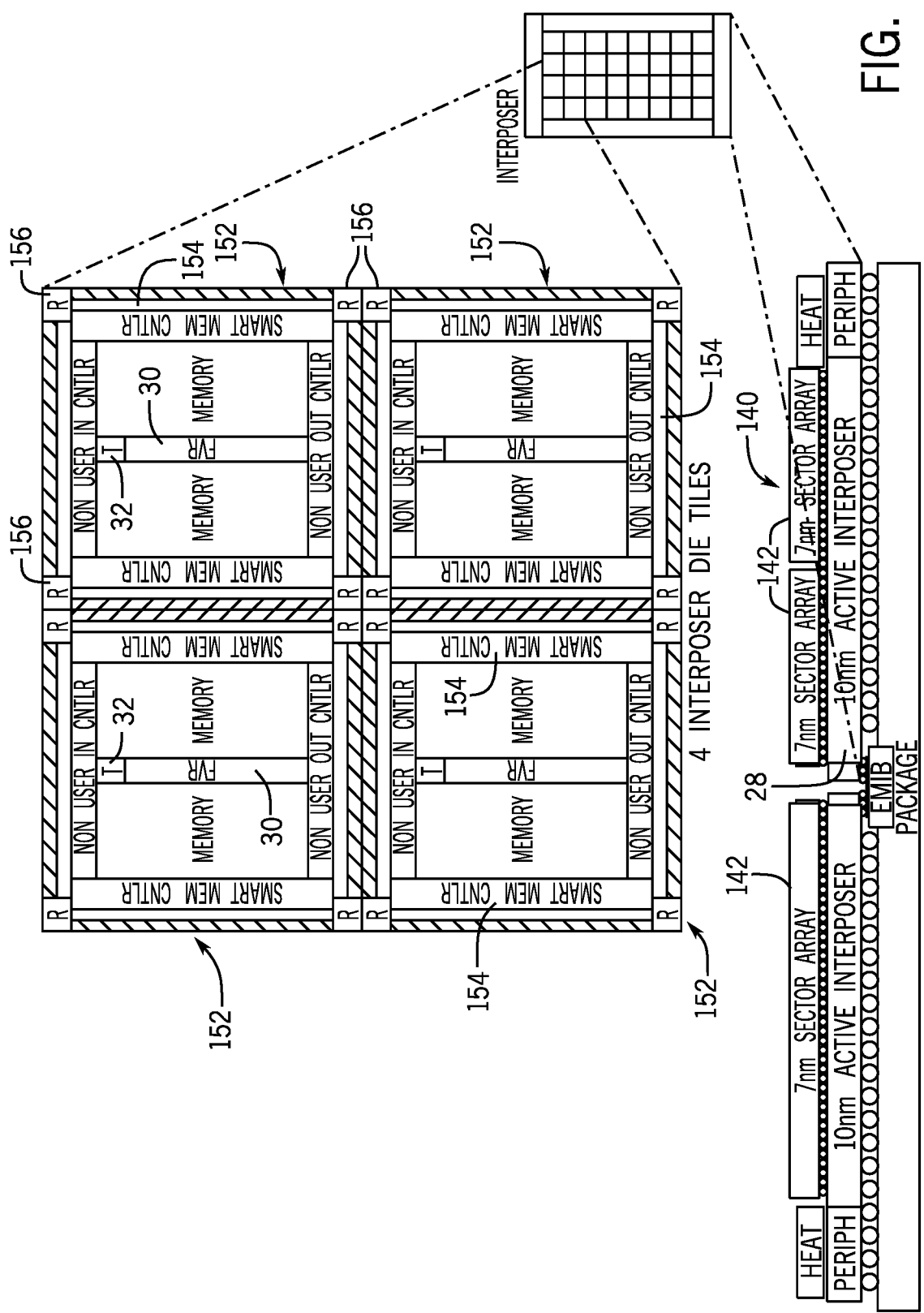
FIG. 9 is a block diagram illustrating a portion of an interposer circuit that has four example tiles that correspond to four sectors of the integrated circuit of FIG. 1, in accordance with an embodiment of the present disclosure.

Referring now to FIG. 9, each die tile 152 may encompass a portion of the interposer circuit 28. In one embodiment, the die tile 152 may include the voltage regulator 30 and the thermal sensor circuit 32. In addition, the die tile 152 may include memory components, memory controllers, input controllers, and output controllers, as described above with reference to FIG. 6. Each of the aforementioned controllers may be accessible via a NOC system 154 integrated between each die tile 152.

With the foregoing in mind, the NOC system 154 may provide communication paths between each die tile 152 via routers 156 disposed at the corners of each die tile 82. The routers 156 may route user data between die tiles 152, to sectors 68, and the like. Since the interposer circuit 28 is separate from the integrated circuit 12, the NOC system 154 may be continuously powered on, even when various sectors 68 of the integrated circuit 12 are powered down. In this way, the NOC system 154 of the interposer circuit 28 may provide an available route to different sectors 68 of the integrated circuit 12 regardless of the positions of powered down sectors 68.

In addition to providing alternative routes for user data between sectors 68, the interposer circuit 28 may provide voltage or voltage signals to different sectors 68 via respective voltage regulators 30 disposed on the interposer circuit 28. For example, each die tile 82 may correspond to a particular sector 68 of the integrated circuit 12. As such, each sector 68 of the integrated circuit 12 may include a respective voltage regulator 30 that provide voltages and voltage signals thereto. Moreover, each sector 68 of the integrated circuit 12 may also include a respective thermal sensor circuit 32 that measures its respective temperature. As a result, power and thermal operations may be managed at an individual sector 68 level without being limited by the boundary of any particular die tile 152. That is, since each die tile 152 may be associated with a particular sector 68, each individual sector 68 may be individually managed with respect to voltage operations and thermal operations.

For example, each sector 68 may be individually managed to receive the same voltage level because each sector 68 is coupled to one voltage regulator 30. In contrast, when a number of sectors 68 were coupled to a single voltage regulator 30 disposed on the integrated circuit 12, the voltage received at each sector 68 may vary due the impedance between each sector 68 and the like. In addition, each sector 68 may receive a voltage at a certain frequency (e.g. voltage frequency scaling) from the individual voltage regulator 30 associated therewith.

In the same manner, the thermal sensor circuit 32 may be positioned underneath or above a respective sector 68 of the integrated circuit, thereby acquiring temperature information or data concerning the respective sector 68. That is, the ability to incorporate thermal sensor circuits 32 within a close proximity for each sector 68 enhances the ability to monitor the temperature of each sector 68. As such, the integrated circuit 12 may have more accurate temperature monitoring for each of the sectors 68 therein. In addition, the controller of the thermal sensor circuit 32 may monitor the temperature of a respective sector 68 to determine whether the temperature is above some threshold associated with reduced performance parameters (e.g., speed, efficiency) of the sector 68 or reduced life expectancy of the sector 68. If the temperature is above the threshold, the controller may send a signal to the respective voltage regulator 30 to reduce the voltage provided to the respective sector 68. In some cases, the controller may send a command to the voltage regulator 30 to power down the respective sector 68 by removing the voltage provided to the respective sector 68.

In addition, the controller of the thermal sensor circuit 32 may monitor the temperature of the respective sector 68 to detect a permanent denial of service (PDOS) attack from another circuit or entity. Generally, PDOS attacks may attempt to overwhelm circuit components that may be part of a sector 68. In certain embodiments, the controller may detect a potential PDOS attack when a temperature of a sector 68 or a group of sectors 68 rises above a threshold, has a rate of rise above a threshold, and the like.

Although the thermal sensor circuit 32 is described as being incorporated into the interposer circuit 28, it should be noted that, in some embodiments, the thermal sensor circuit 32 may be placed on the integrated circuit 12 since the voltage regulators 30 will not be present on the integrated circuit 12. By placing the thermal sensor circuit 32 on the integrated circuit 12, the thermal sensors may more accurately detect the temperature of a respective sector 68 since it is located closer to the respective sector 68.

In addition to providing improved thermal management of sectors 68 in the integrated circuit 12, the interposer circuit 28 may enable improved power management operations via the voltage regulators 30 stored thereon. For example, since each sector 68 may be coupled to a respective voltage regulator 30, each sector 68 may have tighter or more accurate voltage regulation. That is, since a voltage regulator 30 can be dedicated to one sector 68, the voltage (e.g., amplitude, frequency) provided to a particular sector 68 may be catered for that specific sector 68 while avoid voltage drooping and other power supply issues. In addition, each respective voltage regulator 30 may provide per sector 68 or per tile 152 voltage frequency scaling and power down operations. Moreover, in some embodiments, a controller may use a respective voltage regulator 30 to replace a biasgen that may be present on a particular sector 68.

The ability to monitor and control the voltage and thermal properties of a respective sector 68 may also enable a controller to use certain sectors 68 as turbo sectors. Turbo sectors may be sectors 68 that operate with increased throughput by receiving higher voltage levels via the respective voltage regulators 30. In some embodiments, a controller may monitor the temperature of a respective sector 68 to determine whether the sector 68 is below a threshold temperature. If the temperature is below the threshold, the controller may operate the respective sector 68 as a turbo sector by increasing the voltage signal (e.g., amplitude, frequency) provided to the sector 68 via the voltage regulator 30.

In addition to monitoring the temperature of a respective sector 68, a controller may monitor the total power dissipation of the integrated circuit 12. More specifically, the controller may monitor the power consumed by each respective sector 68 and allow certain sectors 68 to use more power (e.g., operate at higher voltage or frequency) while other sectors 68 operate with less power. The controller may, in some embodiments, operate certain sectors 68 as turbo sectors while ensuring that the total power dissipation of the integrated circuit 12 does not exceed some threshold. By employing turbo sectors, the integrated circuit 12 may utilize the sectors 68 more effectively to perform certain operations more efficiently.

Further, by including the additional voltage regulators 30 on the interposer circuit 28, the power delivery network (PDN) of the integrated circuit 12 is improved because each sector 68 may potentially receive an individual source of power. In this way, the integrated circuit 12 may be enabled to perform parallel configuration of the sectors 68 more efficiently because power may be delivered to each sector 68 while the configuration of the sector 68 is occurring. That is, that local regulation of power may provide a more robust response to local power draw used during configuration of the integrated circuit 12. As a result, more sectors 68 may be configured in parallel without causing the power distribution network of the integrated circuit to dip below operational levels, thereby improving configuration performance By way of operation, the voltage operations and the thermal management operations described herein may be performed on a per sector 68 basis, a per tile 152 basis, and the like. That is, in some embodiments, each individual sector 68 may be associated with a respective tile 152 that includes a voltage regulator 30 and thermal sensor circuit 32. In other embodiments, each tile 152 that includes a voltage regulator 30 and thermal sensor circuit 32 may be associated with a collection of sectors 68. As such, the voltage regulator 30 and the thermal sensor circuit 32 of the respective tile 152 may control the voltage operations and the thermal management operations of the respective group of sectors 68.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

Example Embodiments of the Disclosure

The following numbered clauses define certain example embodiments of the present disclosure.

CLAUSE 1. An integrated circuit assembly comprising:
an integrated circuit comprising a plurality of programmable logic sectors; and
an interposer circuit positioned adjacent to the integrated circuit, wherein the interposer circuit comprises:
at least one voltage regulator configured to distribute a voltage to at least one of the plurality of programmable logic sectors; and
at least one thermal sensor configured to measure a temperature of the at least one of the plurality of programmable logic sectors.

CLAUSE 2. The integrated circuit assembly of clause 1, wherein the integrated circuit is coupled to the interposer circuit via a plurality of micro bumps.

CLAUSE 3. The integrated circuit assembly of any of the preceding clauses, wherein the interposer circuit comprises a network on chip (NOC) system configured to communicate data between one or more tiles of the interposer circuit.

CLAUSE 4. The integrated circuit assembly of clause 3, wherein the interposer circuit comprises a plurality of routers configured to communicate the data via the NOC system.

CLAUSE 5. The integrated circuit assembly of any of clauses 1, 2, or 3, comprising a controller configured to:
receive at least one temperature measurement that corresponds to the at least one of the plurality of programmable logic sectors via the at least one thermal sensor; and
send at least one command to the at least one voltage regulator to adjust at least one voltage signal provided to the at least one of the plurality of programmable logic sectors based on the at least one temperature measurement.

CLAUSE 6. The integrated circuit assembly of clause 5, wherein the adjustment to the at least one voltage signal comprises removing a voltage signal, adjusting voltage frequency scaling, or adjusting a voltage amplitude.

CLAUSE 7. The integrated circuit assembly of any of clauses 1, 2, 3, or 5, wherein each of the at least one voltage regulators is configured to provide the voltage to a respective one of the at least one of the plurality of programmable logic sectors.

CLAUSE 8. The integrated circuit assembly of any of clauses 1, 2, 3, 5, or 7, wherein each of the at least one thermal sensors is configured to measure the temperature of a respective one of the at least one of the plurality of programmable logic sectors.

CLAUSE 9. An integrated circuit assembly comprising:
an integrated circuit comprising a plurality of sector, wherein each of the plurality of sectors comprises one or more programmable logic elements;
interposer circuit positioned adjacent to the integrated circuit, wherein the interposer circuit comprises a plurality of voltage regulators and a plurality of thermal sensors; and
a controller configured to control a voltage provided to each of the plurality of sectors via the plurality of voltage regulators based on data acquired by the plurality of thermal sensors.

CLAUSE 10. The integrated circuit assembly of clause 9, wherein the controller is configured to:
determine whether a temperature of one of the plurality of sectors is above a threshold based on the data; and
adjust a voltage provided to the one of the plurality of sectors via one of the plurality of voltage regulators in response to the temperature being above the threshold.

CLAUSE 11. The integrated circuit assembly of any of clauses 9 or 10, wherein the controller is configured to:
determine whether a rate of rise of temperature of one of the plurality of sectors is above a threshold based on the data; and
adjust a voltage provided to the one of the plurality of sectors via one of the plurality of voltage regulators in response to the rate of rise of temperature being above the threshold.

CLAUSE 12. The integrated circuit assembly of any of clauses 9, 10, or 11, wherein the controller is configured to:
determine whether a temperature of one of the plurality of sectors is below a threshold based on the data; and
increase a voltage provided to the one of the plurality of sectors via one of the plurality of voltage regulators in response to the temperature being below the threshold.

CLAUSE 13. The integrated circuit assembly any of clauses 9, 10, 11, or 12, wherein each of the plurality of voltage regulators and each of the plurality of thermal sensors are disposed underneath a respective one of the plurality of sectors.

CLAUSE 14. The integrated circuit assembly of clause 13, wherein each of the plurality of voltage regulators is configured to provide power to the respective one of the plurality of sectors.

CLAUSE 15. The integrated circuit of clause 13, wherein each of the plurality of thermal sensors is configured to measure a temperature of the respective one of the plurality of sectors.

CLAUSE 16. A controller configured to manage power distribution to a plurality of sectors of an integrated circuit, wherein the controller is configured to:
receive temperature data associated with at least one of the plurality of sectors via at least one thermal sensor disposed on an interposer circuit electrically coupled to the integrated circuit; and
adjust at least one voltage signal provided to the at least one of the plurality of sectors via at least one voltage regulator disposed on the interposer circuit based on the temperature data.

CLAUSE 17. The controller of clause 16, wherein the at least one voltage signal is adjusted to remove a voltage provided the at least one of the plurality of sectors, increase or decrease a frequency of the voltage signal provided to the at least one of the plurality of sectors, or increase or decrease an amplitude of the voltage signal provided to the at least one of the plurality of sectors.

CLAUSE 18. The controller of any of clauses 16 or 17, wherein the at least one voltage signal is adjusted per tile of the interposer circuit.

CLAUSE 19. The controller of any of clauses 16, 17, or 18, wherein the at least one voltage signal is adjusted per sector of the plurality of sectors.

CLAUSE 20. The controller of any of clauses 16, 17, 18, or 19, wherein the controller is configured to:
  determine whether power data associated with the plurality of sectors is below a threshold; and
  increase a voltage provided to at least a portion of the plurality of sectors via the at least one voltage regulator in response to the power data being below the threshold.

What is claimed is:

1. An integrated circuit assembly comprising:
  an integrated circuit comprising a plurality of programmable logic sectors, wherein the integrated circuit lacks an integrated voltage regulator; and
  an interposer circuit positioned adjacent to the integrated circuit, wherein the interposer circuit comprises:
    at least one voltage regulator configured to distribute a voltage to at least one of the plurality of programmable logic sectors; and
    at least one thermal sensor configured to measure a temperature of the at least one of the plurality of programmable logic sectors.

2. The integrated circuit assembly of claim 1, wherein the interposer circuit comprises a network on chip (NOC) system configured to communicate data between one or more tiles of the interposer circuit.

3. The integrated circuit assembly of claim 2, wherein the interposer circuit comprises a plurality of routers configured to communicate the data via the NOC system.

4. The integrated circuit assembly of claim 1, comprising a controller configured to:
  receive at least one temperature measurement that corresponds to the at least one of the plurality of programmable logic sectors via the at least one thermal sensor; and
  send at least one command to the at least one voltage regulator to adjust at least one voltage signal provided to the at least one of the plurality of programmable logic sectors based on the at least one temperature measurement.

5. The integrated circuit assembly of claim 1, wherein each of the at least one voltage regulators is configured to provide the voltage to a respective one of the at least one of the plurality of programmable logic sectors.

6. The integrated circuit assembly of claim 1, wherein respective voltage regulators of the at least one voltage regulators are configured to distribute the voltage to respective programmable logic sectors of the plurality of programmable logic sectors.

7. The integrated circuit assembly of claim 1, wherein respective programmable logic sectors of the plurality of programmable logic sectors have respective sector controllers to control operations of that programmable logic sector.

8. An integrated circuit assembly comprising:
  an integrated circuit comprising a plurality of sectors, wherein each of the plurality of sectors comprises one or more programmable logic elements, and wherein a voltage regulator is not present within the integrated circuit; and
  an interposer circuit positioned adjacent to the integrated circuit, wherein the interposer circuit comprises a plurality of voltage regulators, a plurality of thermal sensors, and a controller to control a voltage provided to each of the plurality of sectors via the plurality of voltage regulators based on data acquired by the plurality of thermal sensors.

9. The integrated circuit assembly of claim 8, wherein the controller is configured to:
  determine whether a temperature of one of the plurality of sectors is above a threshold based on the data;
  adjust a voltage provided to the one of the plurality of sectors via one of the plurality of voltage regulators in response to the temperature being above the threshold; and
  shift an operation performed by the one of the plurality of sectors to a second of the plurality of sectors in response to the temperature being above the threshold.

10. The integrated circuit assembly of claim 8, wherein the controller is configured to:
  determine whether a rate of rise of temperature of one of the plurality of sectors is above a threshold based on the data; and
  adjust a voltage provided to the one of the plurality of sectors via one of the plurality of voltage regulators in response to the rate of rise of temperature being above the threshold.

11. The integrated circuit assembly of claim 8, wherein the controller is configured to:
  determine whether a temperature of one of the plurality of sectors is below a threshold based on the data; and
  increase a voltage provided to the one of the plurality of sectors via one of the plurality of voltage regulators in response to the temperature being below the threshold.

12. The integrated circuit assembly of claim 8, wherein each of the plurality of voltage regulators and each of the plurality of thermal sensors are disposed underneath a respective one of the plurality of sectors.

13. The integrated circuit assembly of claim 12, wherein each of the plurality of voltage regulators is configured to provide power to the respective one of the plurality of sectors.

14. The integrated circuit assembly of claim 8, wherein each of the plurality of sectors has an associated sector controller to control operations of each of the plurality of sectors.

15. A controller configured to manage power distribution to a plurality of sectors of an integrated circuit, wherein the integrated circuit lacks an integrated voltage regulator, and wherein the controller is configured to:
  receive temperature data associated with at least one of the plurality of sectors via at least one thermal sensor disposed on an interposer circuit electrically coupled to the integrated circuit; and
  adjust at least one voltage signal provided to the at least one of the plurality of sectors via at least one voltage regulator disposed on the interposer circuit that supplies regulated voltage to the at least one of the plurality of sectors based on the temperature data.

16. The controller of claim 15, wherein the at least one voltage signal is adjusted to remove a voltage provided to the at least one of the plurality of sectors, increase or decrease a frequency of the voltage signal provided to the at least one of the plurality of sectors, or increase or decrease an amplitude of the voltage signal provided to the at least one of the plurality of sectors.

17. The controller of claim 15, wherein the at least one voltage signal is adjusted per tile of the interposer circuit.

18. The controller of claim 15, wherein the at least one voltage signal is adjusted per sector of the plurality of sectors.

19. The controller of claim 15, wherein the controller is configured to:
  determine whether power data associated with the plurality of sectors is below a threshold; and
  increase a voltage provided to at least a portion of the plurality of sectors via the at least one voltage regulator in response to the power data being below the threshold.

20. The controller of claim 15, wherein the controller causes each of the at least one voltage regulators to distribute voltage to a respective one of the plurality of programmable logic sectors.

* * * * *